United States Patent [19]

McNeilly

[11] Patent Number: 4,563,660
[45] Date of Patent: Jan. 7, 1986

[54] NOISE ISOLATION SYSTEM FOR HIGH-SPEED CIRCUITS

[75] Inventor: David R. McNeilly, Maryville, Tenn.

[73] Assignee: The Government of the United States of America as represented by the United States Department of Energy, Washington, D.C.

[21] Appl. No.: 566,760

[22] Filed: Dec. 29, 1983

[51] Int. Cl.⁴ .............................................. H03H 7/01
[52] U.S. Cl. ..................................... 333/181; 333/12; 333/167; 330/199
[58] Field of Search ............... 333/167, 172, 175, 176, 333/181–185, 243, 245, 12; 334/85; 330/68, 296, 297, 261, 307, 199

[56] References Cited

U.S. PATENT DOCUMENTS

| | | | |
|---|---|---|---|
| 1,953,465 | 4/1934 | Chesnut | 333/185 X |
| 3,530,393 | 9/1970 | Thatch et al. | 330/199 X |
| 3,760,298 | 9/1973 | Pell | 333/12 |

Primary Examiner—Marvin L. Nussbaum
Attorney, Agent, or Firm—David E. Breeden; Stephen D. Hamel; Judson R. Hightower

[57] ABSTRACT

A noise isolation circuit is provided that consists of a dual function bypass which confines high-speed switching noise to the component or circuit which generates it and isolates the component or circuit from high-frequency noise transients which may be present on the ground and power supply busses. A local circuit ground is provided which is coupled to the system ground by sufficient impedance to force the dissipation of the noise signal in the local circuit or component generating the noise. The dual function bypass network couples high-frequency noise signals generated in the local component or circuit through a capacitor to the local ground while isolating the component or circuit from noise signals which may be present on the power supply busses or system ground. The network is an effective noise isolating system and is applicable to both high-speed analog and digital circuits.

6 Claims, 4 Drawing Figures

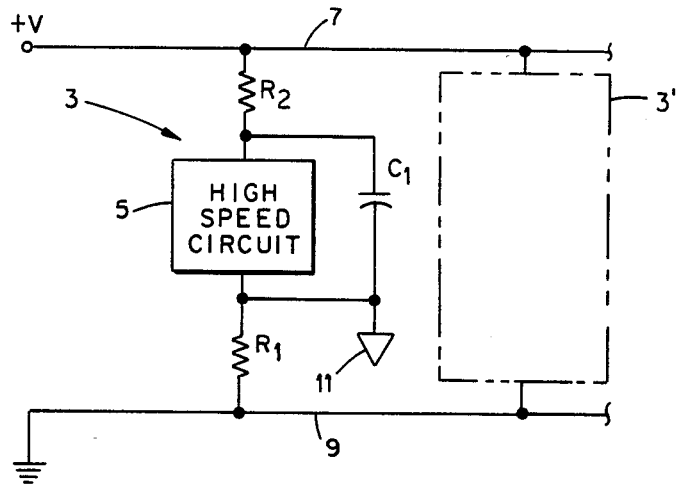
_Fig. 1_
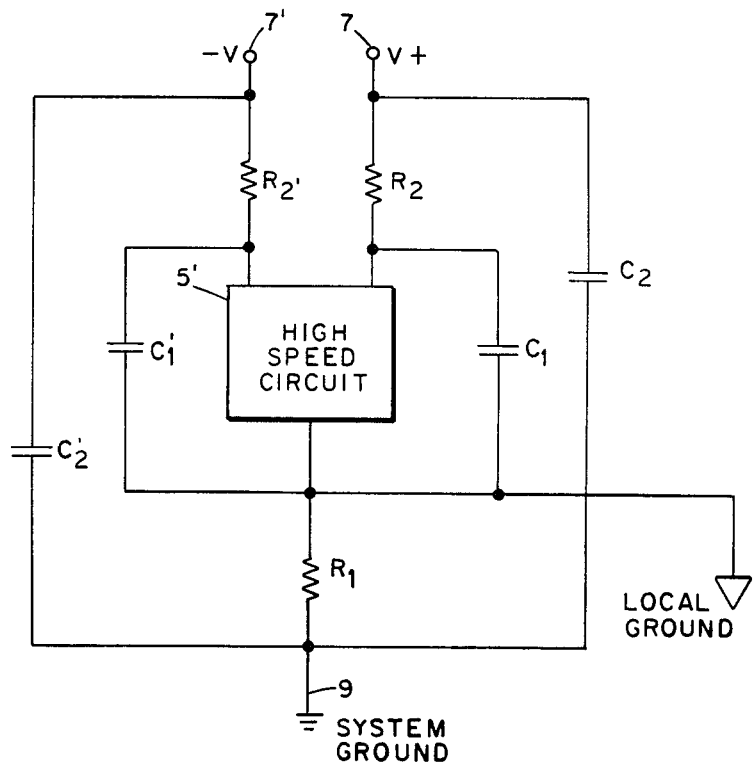
_Fig. 2_

NOISE ISOLATION SYSTEM FOR HIGH-SPEED CIRCUITS

This invention is a result of a contract with the United States Department of Energy.

BACKGROUND OF THE INVENTION

This invention relates generally to noise bypass filtering circuits and more specifically to bypass filtering circuits for high-speed circuits.

In electrical systems that utilize high-speed analog or digital components, high-frequency noise (typically noise signals having a frequency above 5 MHz) is injected into the ground that supply busses due to the fast response time and large amplitude excursions of the signal processing components. Such noise transients, often referred to as a noise spike can seriously limit the sensitivity and stability of analog circuits. Further, in some digital circuit applications, the high-speed switching noise may be of such a magnitude to cause errors in the digital operations. Conventional bypass filtering, in which the noise signals on power supply busses are bypassed directly to ground through a bypass capacitor, will not work to isolate a component from these very fast noise transients because they cannot be instantaneously absorbed by the system ground. Instead, they persist on the busses and in other closely connected circuits for sufficient periods to alter the ground reference or bias voltage sufficient for a high-speed circuit to respon to the bias or ground voltage error. This, in turn, may cause an erroneous switching transition in a digital circuit or output state change in a comparator circuit, for example. Thus, there is a need for a bypass filter network for use in high-speed circuits which confine high frequency noise generated in a system component to the component in which it is generated in order to prevent noise contamination of power supply and ground busses in a high-speed electronic system.

SUMMARY OF THE INVENTION

In view of the above need, it is an object of this invention to provide a bypass filter network for isolating high frequency noise in high-speed electronic circuits.

Other objects and many of the attendant advantages of the present invention will be apparent to those skilled in the art from the following detailed description taken in conjunction with the drawings.

In summary, the invention is a bypass filter network for essentially isolating high frequency noise in a high-speed circuit which is coupled to a biasing system including at least one power supply bus and a system ground bus. A first impedance element is connected between a local ground bus connected to the common ground terminals of the high-speed circuit and the system ground bus. This first impedance element has sufficient impedance to substantially block high-frequency noise transient signals generated at the biasing terminals of the circuit from the system ground and provide means for dissipating the energy of the noise signals generated by the high-speed circuit which are injected into the biasing network. A second impedance element is connected between the system power supply bus and a biasing input of the high-speed circuit to substantially block high-frequency noise transients generated at the biasing input from the system power supply bus. These noise transients are coupled directly to the local ground bus by means of a bypass capacitor connected between the biasing input of the circuit and the local ground bus so that high-frequency noise transients generated by the circuit at the biasing terminal are coupled directly to the local ground.

Additionally, the circuit may be isolated from high-frequency noise which may be present on the system supply bus by means of a further bypass capacitor connected between the supply bus at the second impedance connection thereto and the system ground bus so that these signals are coupled directly to the system ground and do not appear at the circuit biasing terminal.

BRIEF DESCRIPTION OF THE DRAWINGS

FIG. 1 is a schematic diagram of a basic bypass filter network for a high-speed circuit (shown in block form) according to the present invention for use in a system where a number of circuits are connected to the system supply bus.

FIG. 2 is a schematic diagram of a bypass filter network for a high-speed circuit according to the present invention for use in a system in which two power supply busses are employed and further includes additional bypass capacitors for coupling any high-frequency noise on other supply busses directly to the system ground to essentially isolate the high-speed circuit from high-frequency noise transients on the supply or system ground busses as well as isolating the busses from noise generated in the high-speed circuit.

DETAILED DESCRIPTION

Figures 3, 4:
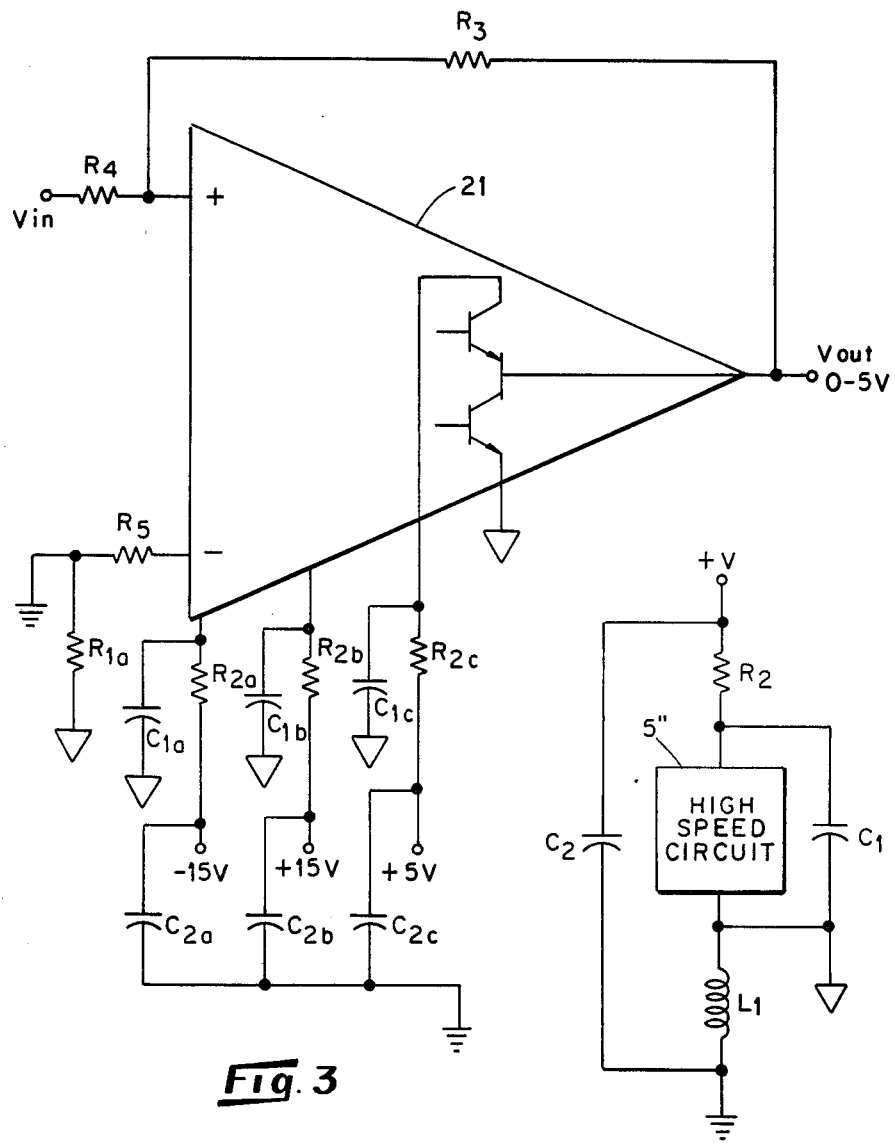
FIG. 3 is a detailed schematic diagram of a specific application of a bypass filter network according to the present invention in a high-speed comparator network which requires connection to three separate system power supply busses as well as a system ground.
FIG. 4 is a schematic diagram of an alternate embodiment of the present invention in which illustrates the use of an inductor substituted for a resistor to block the high-frequency noise transients to isolate the noise signals.

Referring now to FIG. 1, wherein there is shown a system including a number of circuits 3 connected to a bussing arrangement, each including a basic bypass filter network according to the present invention. Each circuit 3 includes a high-speed circuit 5 which is connected to the system supply bus 7 at a biasing input thereof through a resistor $R_2$. The ground connection of circuit 5 is connected through a resistor $R_1$ to the system ground 9 forming a local circuit ground reference 11. A bypass capacitor $C_1$ is connected between the biasing input of circuit 5 and the local ground 11. With this basic arrangement, high-frequency noise transient signals generated at the biasing input of the circuit 5 are coupled directly to the local ground 11 and thus blocked from the supply bus 7 by the low pass filter action of $R_2C_2$. Further, these high-frequency noise transients are blocked from the system ground 9 by means of the blocking resistor $R_1$. The noise signal energy is then quickly dissipated in $R_1$ which is controlled by the RC time constant of the capacitor $C_1$ in combination with primarily the resistance $R_1$ and the high-speed circuit impedance. The value of resistor $R_1$ is kept as low as possbile (typically less than 3 ohms) to allow the proper biasing of the circuit 5 while substantially blocking the high-frequency noise transients from the system ground 9 and providing dissipation of the noise signal energy. This arrangement substantially isolates high frequency noise transients to the circuit that is generating the noise.

Further, the circuit 5 may also be isolated from any high-frequency noise which may appear on the supply bus by means of the addition of a further capacitor $C_2$ (as illustrated in FIG. 2) between the connection of $R_2$ to the bus 7 and the system ground 9. Capacitor $C_2$ couples any high-frequency noise on the supply bus directly to the system ground thus blocking it from entering the biasing terminal of the high-speed circuit 5'.

Additionally, FIG. 2 illustrates a bypass filter network for a high-speed circuit 5' which has two biasing inputs (+V and −V). The circuit elements for the −V bus (7') connection are identical to the elements shown for the +V bus connection in FIG. 1 and FIG. 2 and are identified by like primed reference characters.

It will be understood that the high-speed circuit may take various forms of either high-speed analog or digital circuit elements such as fast acting analog comparators, wideband operational amplifiers, wideband transistors or digital switching circuits. The invention is applicable to an electronic system in which a number of high-speed circuits are connected to common biasing busses or an electronic system such as a large-scale digital computer; combined digital and analog systems such as used in data acquisition, for example; or high-speed low-noise analog systems like pulse amplifiers, wideband amplifiers, comparators, etc.

In order to more specifically illustrate the invention, a specific example, is illustrated in FIG. 3 for a high-speed comparator. The comparator cicuit is connected in a conventional comparator configuration. An operational amplifier 21 is connected in a positive feedback arrangement by connecting the output through a resistor $R_3$ to the non-inverting (+) input. The input signal ($V_{in}$) to he comparator is coupled through an input resistor $R_4$ to the + input of amplifiers 21. The input signal is compared to a reference signal, in this case the system ground potential, by connecting the inverting input (−) of amplifier 21 to ground through a resistor $R_5$. In this arrangement the output switches states from 0 to 5 volts vary rapidly when $V_{in}$ exceeds the reference voltage applied to the − input and vice versa. Since the output of the amplifier is connected with positive feedback to the input of the amplifier, the output switches to the 5 volt saturated state very fast. This, in turn, causes a very high frequency noise transient on the +5V biasing input connected to the transistor output stage which is partially shown within the amplifier block. Without the bypass filter network according to the present invention this noise transient would appear on the +5V system bus and could produce errors in other parts of the system connected to the bus as pointed out above.

In accordance with the present invention, bypass filter circuits are connected in each of the three separate biasing inputs and a local ground is established, as indicated by the triangular ground symbol, by connecting a resistor $R_{1a}$ between the system ground and the local ground. The elements which have the identical function of elements ($R_1$, $R_2$, $C_1$ and $C_2$) are shown with identical subscript numbers to those of FIGS. 1 and 2, but with different subscript letters to properly identify the separate elements of the circuit of FIG. 3 in the table of values given below. For example, the +5 volt bus is connected through resistor $R_{2c}$ to the +5V biasing input of amplifier 21. The bypass capacitor $C_{1c}$, which couples the high-frequency noise signals generated in the circuit on the +5 input to the local ground, is connected between the +5V input to the amplifier 21 and the local ground bus. The bypass capacitor $C_{2c}$ is connected between the +5V system bus and the system ground to couple noise signals on the +5V system bus directly to the system ground thereby isolating the comparator from any higg-frequency noise which may be present on the system bus. Likewise, the other system supply busses are connected to the appropriate biasing inputs of the amplifier 21 as shown in FIG. 3. The operation of each of the separate filter networks are identical to that of the networks of FIGS. 1 and 2. The various components of the circuit of FIG. 3 are provided in the following table.

TABLE

| Element | Value |
|---|---|
| $R_{1a}$ | 2.7 ohms |
| $R_{2a}$ | 10 ohms |
| $R_{2b}$ | 10 ohms |
| $R_{2c}$ | 3 ohms |
| $R_3$ | 1 megohm |
| $R_4$ | 1 killohm |
| $R_5$ | 1 killohm |
| $C_{1a}$ | 1.0 Microforad |
| $C_{1b}$ | 1.0 Microforad |
| $C_{1c}$ | 1.0 Microforad |
| $C_{2a}$ | — |
| $C_{2b}$ | — |
| $C_{2c}$ | — |

The operational amplifier 21 is a mode LM 361 supplied by National Semiconductor, Santa Clara, Calif. It will become obious to those skilled in the art that various other elements and values may be used for various applications.

Referring now to FIG. 3 an alternate embodiment of the bypass filter network according to the present invention is shown which may be used for noise isolation of a high-speed circuit 5" which cannot tolerate resistance in its ground connection. A typical circuit of this type is an H-type TTL logic circuit which operates at high d.c. bias current levels. In this case an inductor $L_1$ is substituted for the resistor $R_1$ of FIG. 1 or FIG. 2 and is used to block the high-frequency noise transistor generated in the circuit 5" from the system ground. The operation of this bypass filter network is identical to that of the previously described networks. The energy in this circuit is slowsly absorbed by the system ground. In some applications such as where no d.c. voltage power drop may be tolerated, the resistor $R_2$ may also be replaced by an inductor to achieve the same bypass filtering results.

These and other modifications and variations of this invention will be apparent to those skilled in the art and may be made without departing from the spirit and scope of this invention as set forth in the following claims attached to and forming a part of this specification.

I claim:

1. A bypass filter network for essentially isolating high-frequency noise in a high-speed circuit connected in an electronic system having a biasing arrangement including at least one power supply bus and a system ground bus; comprising:
   a high-speed circuit having a bias voltage input terminal and a ground terminal;
   a local ground bus connected to said ground terminal of said high-speed circuit;

a first impedance element connected between said local ground bus and said system ground bus, said first impedance element having sufficient impedance to substantially block high-frequency noise transient signals generated at said ground terminal of said high-speed circuit from said system ground and substantially dissipate the energy of said high-frequency noise transient signals generated by said high-speed circuit;

a second impedance element connected between said at least one power supply bus and said bias voltage input of said high-speed circuit, said second impedance element having sufficient impedance to substantially block high frequency noise transient signals generated at said bias voltage input of said high-speed circuit from said at least one power supply bus;

a first bypass capacitor connected between said bias voltage input of said high-speed circuit and said local ground bus so that said high-frequency noise transient signals generated at said bias voltage input of said high-speed circuit are coupled directly to said local ground bus; and a second bypass capacitor connected between said at least one power supply bus and said system ground bus to directly couple high-frequency noise signals on said at least one power supply bus to said system ground bus thereby essentially isolating said high-speed circuit from high-frequency noise signals appearing on said at least one power supply bus.

2. The bypass filter network as set forth in claim 1 wherein said first and second impedance elements are resistors.

3. The bypass filter network as set forth in claim 1 wherein said first impedance element is an inductor.

4. The bypass filter network as set forth in claim 3 wherein said second impedance is an inductor.

5. In an electronic system having a plurality of high-speed circuits connected to a biasing network including at least one power supply bus and a system ground bus, each high-speed circuit including a bias voltage input terminal and a ground terminal a bypass filter network for essentially isolating high-frequency noise in said high-speed circuits, comprising:

a local ground bus connected to said bias voltage input of said high-speed circuit;

a first impedance element connected between said local ground bus and said system ground bus, said first impedance element having sufficient impedance to substantially block high-frequency noise transient signals generated at said ground terminal of said high-speed circuit from said system ground and substantially dissipate the energy of said high-frequency noise transient signals generated by said high-speed circuit;

a second impedance element connected between said at least one power supply bus and said bias voltage input of said high-speed circuit, said second impedance element having sufficient impedance to substantially block high frequency noise transient signals generated at said bias voltage input of said high-speed circuit from said at least one power supply bus;

a first bypass capacitor connected between said bias voltage input of said high-speed circuit and said local ground bus so that said high-frequency noise transient signals generated at said bias voltage input of said high-speed circuit are coupled directly to said local ground bus; and a second bypass capacitor connected between said at least one power supply bus and said system ground bus for essentially isolating said high-speed circuit from high-frequency noise signals appearing on said at least one power supply bus.

6. The combination as set forth in claim 5 wherein said at least one power supply bus includes a plurality of separate power supply busses and wherein each of said high-speed circuits includes a corresponding plurality of bypass filter networks as set forth in claim 5 separately connecting each of said plurality of power supply busses to corresponding ones of said plurality of high-speed circuits.

* * * * *